(12) United States Patent
Kunitomo et al.

(10) Patent No.: US 11,070,024 B2
(45) Date of Patent: Jul. 20, 2021

(54) SEMICONDUCTOR LASER DEVICE

(71) Applicant: SHARP KABUSHIKI KAISHA, Sakai (JP)

(72) Inventors: Jun Kunitomo, Sakai (JP); Nobuhiro Ohkubo, Sakai (JP); Akiyoshi Sugahara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 26 days.

(21) Appl. No.: 16/612,051

(22) PCT Filed: Apr. 9, 2018

(86) PCT No.: PCT/JP2018/014846
§ 371 (c)(1),
(2) Date: Nov. 8, 2019

(87) PCT Pub. No.: WO2018/207518
PCT Pub. Date: Nov. 15, 2018

(65) Prior Publication Data
US 2020/0067268 A1 Feb. 27, 2020

(30) Foreign Application Priority Data
May 11, 2017 (JP) .............................. JP2017-094462

(51) Int. Cl.
*H01S 5/0233* (2021.01)
*H01S 5/024* (2006.01)
(Continued)

(52) U.S. Cl.
CPC ........ *H01S 5/02476* (2013.01); *H01S 5/0206* (2013.01); *H01S 5/0233* (2021.01);
(Continued)

(58) Field of Classification Search
CPC ............... H01S 5/02476; H01S 5/0206; H01S 5/02469; H01S 5/02208; H01S 5/02212;
(Continued)

(56) References Cited

U.S. PATENT DOCUMENTS 4,763,335 A * 8/1988 Chamuel ............. H01S 5/02208
372/33
10,804,675 B2 * 10/2020 Takizawa ............ H01S 5/02469
(Continued)

FOREIGN PATENT DOCUMENTS

JP      S62-008655 Y2     2/1987
JP      S62-166588 A     7/1987
(Continued)

*Primary Examiner* — Yuanda Zhang
(74) *Attorney, Agent, or Firm* — ScienBiziP, P.C.

(57) ABSTRACT

In a semiconductor laser device that includes: a semiconductor laser element that outputs light from an output portion; and a metal stem that holds the semiconductor laser element, the metal stem includes a base that has a reference surface on an upper surface and a protrusion portion that protrudes upward from the reference surface, and the protrusion portion is provided with an installation surface on which the semiconductor laser element is installed and a side surface which is disposed on an identical plane with a part of an outer circumferential surface of the base.

11 Claims, 5 Drawing Sheets

(51) Int. Cl.
  *H01S 5/02*     (2006.01)
  *H01S 5/02212*  (2021.01)
  *H01S 5/323*    (2006.01)
  *H01S 5/02218*  (2021.01)
  *H01S 5/02208*  (2021.01)

(52) U.S. Cl.
  CPC ...... *H01S 5/02208* (2013.01); *H01S 5/02212* (2013.01); *H01S 5/02218* (2021.01); *H01S 5/02469* (2013.01); *H01S 5/32308* (2013.01)

(58) Field of Classification Search
  CPC .... H01S 5/0231; H01S 5/0232; H01S 5/0238; H01S 5/02375; H01S 5/02218; H01S 5/32308; H01S 5/0233; H01S 5/023; H01S 5/0235
  See application file for complete search history.

(56) References Cited

U.S. PATENT DOCUMENTS

| | | | |
|---|---|---|---|
| 2005/0089070 A1 | 4/2005 | Honda | |
| 2006/0120226 A1 | 6/2006 | Mutou et al. | |

FOREIGN PATENT DOCUMENTS

| | | |
|---|---|---|
| JP | 2003-188456 A | 7/2003 |
| JP | 2006-024961 A | 1/2006 |
| JP | 2006-190736 A | 7/2006 |

\* cited by examiner

SEMICONDUCTOR LASER DEVICE

TECHNICAL FIELD

The present invention relates to a semiconductor laser device having a metal stem.

BACKGROUND ART

In recent years, a semiconductor laser device that is equipped with a semiconductor laser element which outputs laser light has expanded applications and has been used in respective industrial fields. Thus, market demand has been diversified, and the semiconductor laser element has been strictly requested to realize high output and high operation guaranteed temperature.

When the semiconductor laser element performs a high-output operation at high temperature, the temperature of the element rises due to heat generation, resulting in deterioration of characteristics or degradation of reliability in the element. Thus, improvement of a heat dissipation characteristic of the semiconductor laser element is required.

PTL 1 discloses a semiconductor laser device that suppresses a temperature rise of a semiconductor laser element. The semiconductor laser device is formed of a CAN package type and has a heat dissipation element attached to a metal stem that holds the semiconductor laser element. The heat dissipation element has a Peltier element sandwiched between an endothermic plate and a heat dissipation plate, and the metal stem is disposed on the endothermic plate in a contact manner. Additionally, a thermistor that detects temperature is attached to the endothermic late and the thermistor is connected a temperature detection circuit.

When the Peltier element is driven in accordance with a temperature change detected by the thermistor, heat generated by the semiconductor laser device is absorbed by the endothermic late and is then dissipated from the heat dissipation plate. Thereby, the temperature rise of the semiconductor laser element is suppressed.

CITATION LIST

Patent Literature

PTL 1: Japanese Unexamined Patent Application Publication No. 2003-188456 (rages 3 and 4 and FIG. 3)

SUMMARY OF INVENTION

Technical Problem

However, according to the above-mentioned conventional semiconductor laser device, the Peltier element and the thermistor are provided and a power supply unit that drives the Peltier element is separately required. Thus, there is a problem that the semiconductor laser device has a complicated configuration and a large size.

An aspect of the invention aims to provide a semiconductor laser device capable of improving a heat dissipation characteristic with a simple configuration.

Solution to Problem

In order to achieve the aforementioned aim, an aspect of the invention provides a semiconductor laser device including: a semiconductor laser element that outputs light from an output portion; and a metal stem that holds the semiconductor laser element, in which the metal stem includes a base that has a reference surface on an upper surface and a protrusion portion that protrudes upward from the reference surface, and the protrusion portion has an installation surface on which the semiconductor laser element is installed and a side surface which is disposed on an identical plane with a part of an outer circumferential surface of the base.

According to an aspect of the invention, in the semiconductor laser device having the aforementioned configuration, an upper side of the semiconductor laser element is open.

According to an aspect of the invention, in the semiconductor laser device having the aforementioned configuration, the base is formed into a columnar shape.

According to an aspect of the invention, in the semiconductor laser device having the aforementioned configuration, a part of the side surface of the protrusion portion and a part of the outer circumferential surface of the base are formed of a plane parallel to the installation surface.

According to an aspect of the invention, in the semiconductor laser device having the aforementioned configuration, an exclusive possession area of the protrusion portion on the reference surface is 50% or more.

According to an aspect of the invention, in the semiconductor laser device having the aforementioned configuration, the metal stem includes a pair of leads that is connected to the semiconductor laser element by penetrating the base, the base is formed to be substantially line symmetric with a center line that is parallel to the installation surface in top view, the protrusion portion is installed on a first region and a second region that are obtained by division by the center line, the installation surface and the leads are disposed only in the first region, and the side surface of the protrusion portion is disposed on a circumferential edge of the second region.

According to an aspect of the invention, in the semiconductor laser device having the aforementioned configuration, centers of the leads and the output portion are disposed on a straight line in top view.

According to an aspect of the invention, in the semiconductor laser device having the aforementioned configuration, a plurality of notches are provided on the outer circumferential surface of the base, and upper parts of the notches are covered by the protrusion portion.

According to an aspect of the invention, in the semiconductor laser device having the aforementioned configuration, materials of the base and the protrusion portion are formed of copper-based metal.

According to an aspect of the invention, in the semiconductor laser device having the aforementioned configuration, the semiconductor laser element is disposed on the installation surface via a sub-mount, and the sub-mount is formed of a material of AlN or SiC.

According to an aspect of the invention, in the semiconductor laser device having the aforementioned configuration, the semiconductor laser element includes a GaAs-based substrate and outputs red light.

According to an aspect of the invention, in the semiconductor laser device having the aforementioned configuration, the semiconductor laser element includes a GaN-based substrate and outputs green light.

Advantageous Effects of Invention

According to an aspect of the invention, a protrusion portion that protrudes upward from a reference surface of a base has an installation surface of a semiconductor laser element and a side surface that is disposed on the same plane as a part of an outer circumferential surface of the base. Thus, heat transmitted from the semiconductor laser element to the protrusion portion is dissipated from the base and dissipated from the side surface of the protrusion portion. Moreover, it is possible to increase a volume and a surface area of the protrusion portion above the base and increase a bonding area between the protrusion portion and the base. Accordingly, it is possible to suppress a temperature rise of the semiconductor laser element by improving a heat dissipation characteristic of a semiconductor laser device with a simple configuration.

DESCRIPTION OF EMBODIMENTS

First Embodiment

Figure 1:
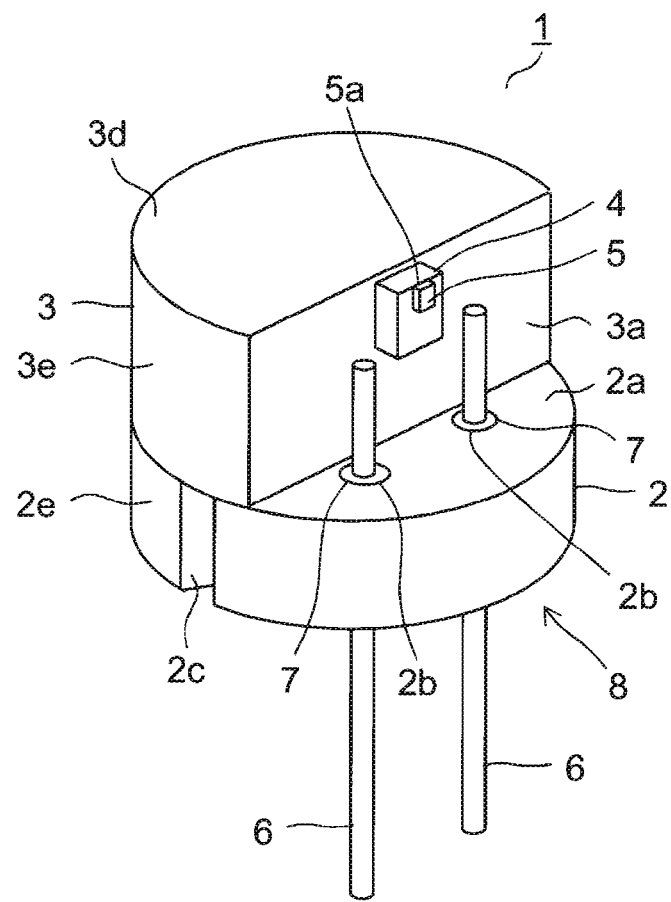
FIG. 1 is a perspective view of a semiconductor laser device of a first embodiment of the invention as seen from a front side.
Figure 2:
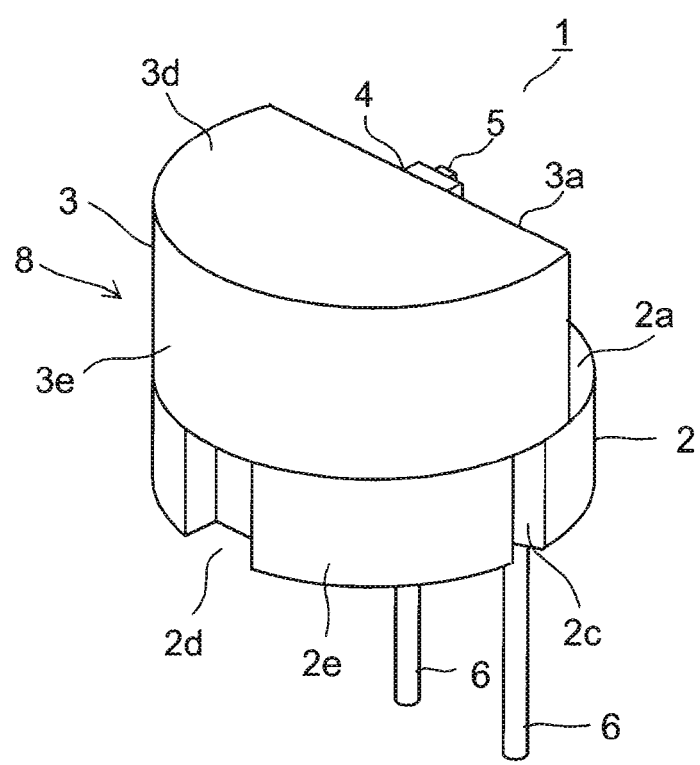
FIG. 2 is a perspective view of the semiconductor laser device of the first embodiment of the invention as seen from a rear side.
Figure 3:
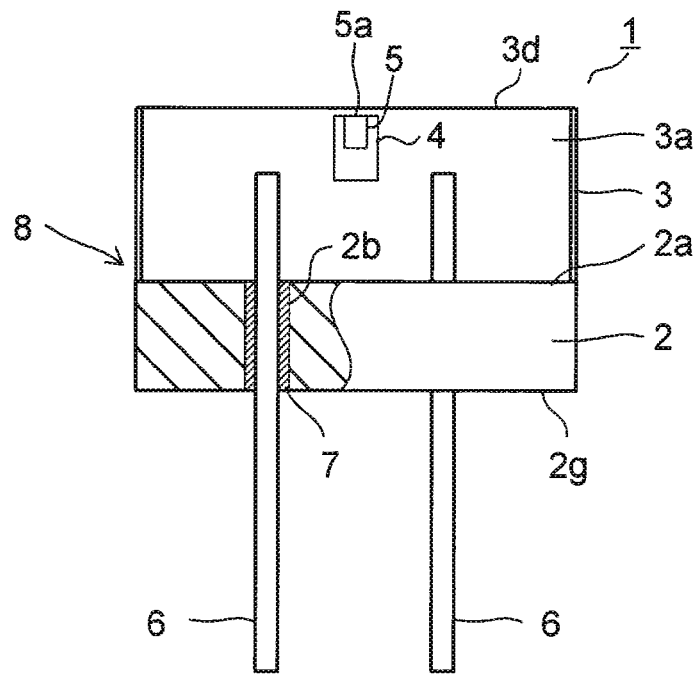
FIG. 3 is a front view illustrating the semiconductor laser device of the first embodiment of the invention.
Figure 4:
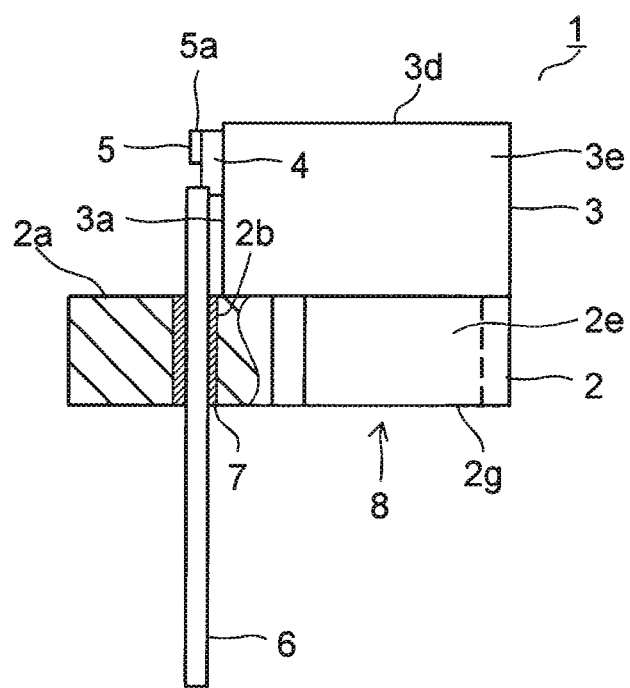
FIG. 4 is a side view illustrating the semiconductor laser device of the first embodiment of the invention.
Figure 5:
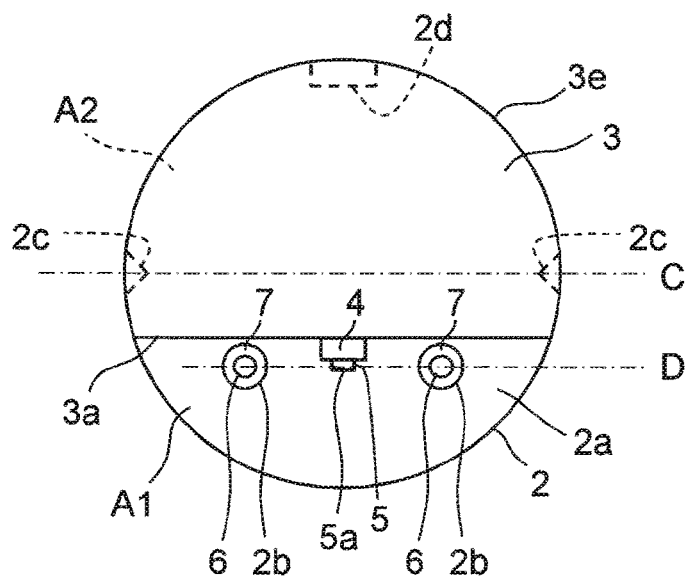
FIG. 5 is a top view illustrating the semiconductor laser device of the first embodiment of the invention.

An embodiment of the invention will be described below with reference to drawings. FIGS. 1 and 2 are perspective views of a semiconductor laser device of a first embodiment of the invention as seen from a front side and a rear side, respectively. FIGS. 3, 4, and 5 are respectively a front view, a side view, and a top view of the semiconductor laser device.

A semiconductor laser device 1 includes a semiconductor laser element 5, a sub-mount 4, and a metal stem 8. The semiconductor laser device 1 has no cap covering the semiconductor laser element 5 and is formed of a capless package type in which an upper side of the semiconductor laser element 5 is open.

The semiconductor laser element 5 is formed by laminating a predetermined semiconductor thin film on a GaAs-based substrate and outputs red light from an output portion 5a on an upper surface. The semiconductor laser element 5 may be formed by laminating a semiconductor thin film on a GaN-based substrate and output green light from the output portion 5a.

One surface of facing surfaces of the sub-mount 4 is bonded to the semiconductor laser element and the other surface is bonded to an installation surface 3a of the metal stem 8 which is described later. The sub-mount 4 is excellent in hardness, heat resistance, and chemical stability, and is formed of AlN or SiC whose thermal conductivity is high. Thereby, the sub-mount 4 is not deformed due to heat by the semiconductor laser element 5 and the heat by the semiconductor laser element 5 is able to be efficiently transmitted to the metal stem 8. Accordingly, a heat dissipation characteristic of the semiconductor laser device 1 is improved.

The metal stem 8 includes an eyelet 2, a protrusion portion 3, and leads 6. The eyelet 2, the protrusion portion 3, and the leads 6 are formed of metal, and are more desirably formed of copper-based metal whose heat conductivity is high because the heat dissipation characteristic is able to be improved.

The eyelet 2 (base) is formed into a columnar shape that is substantially line symmetric with a center line C in top view, and has an outer circumferential surface 2e that is a cylindrical surface. A reference surface 2a which is flat and on which the protrusion portion 3 is installed is formed on an upper surface of the eyelet 2.

The eyelet 2 is provided with a pair of through holes 2b that penetrate vertically. The leads 6 are inserted into the respective through holes 2b so as to protrude from the reference surface 2a and a bottom surface 2g, and are hermetically sealed via an insulator 7 such as glass. The leads 6 are connected to the semiconductor laser element 5 via a wire (not illustrated).

On the outer circumferential surface 2e of the eyelet 2, notches 2c and a notch 2d for positioning are provided in a recessed form. A pair of notches 2c is provided to be opposed at 180°, and the notch 2d is provided between both of the notches 2c. The notches 2c and the notch 2d enable the semiconductor laser device 1 to be easily positioned at a time of mounting, and the output portion 5a is able to be arranged at a predetermined position. This makes it possible to accurately perform evaluation of characteristics, such as a polarization angle or FFP (Far Field Pattern), of the semiconductor laser device 1.

Figure 6:
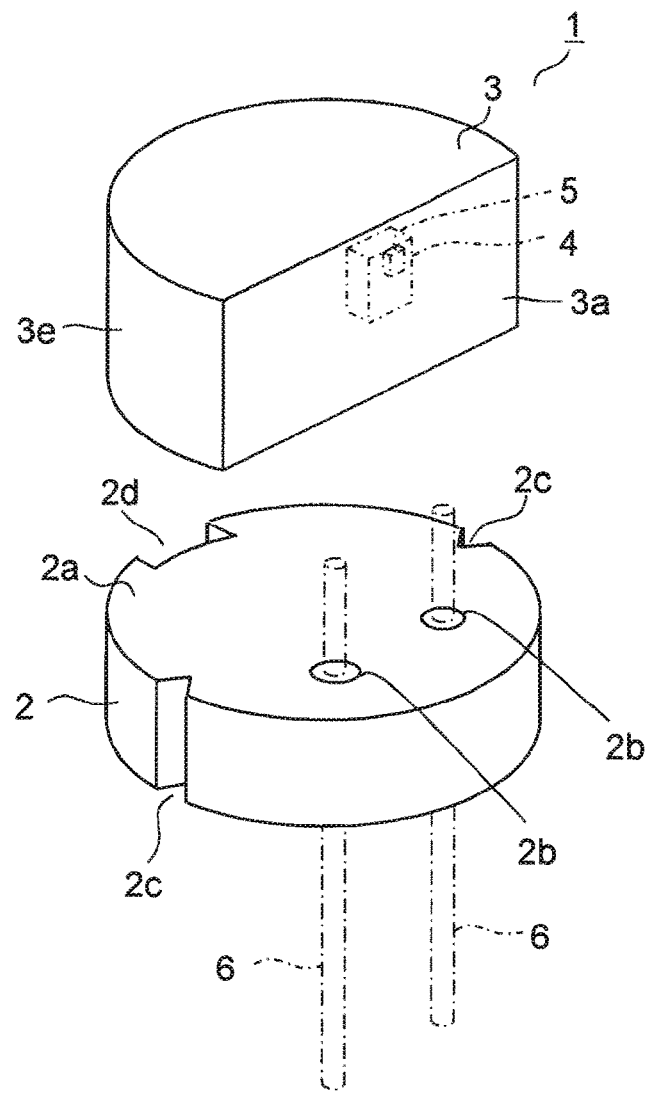
FIG. 6 is an exploded perspective view of the semiconductor laser device of the first embodiment of the invention.

FIG. 6 is an exploded perspective view of the metal stem 8. The protrusion portion 3 is bonded to the reference surface 2a of the eyelet 2 and protrudes upward from the reference surface 2a. Upper sides of the notches 2c and the notch 2d of the eyelet 2 are covered by the protrusion portion 3.

An upper surface 3d and a lower surface of the protrusion portion 3 are formed to be planes parallel to each other. Moreover, the protrusion portion 3 includes a heat dissipation surface 3e, which is formed by a side surface, and the installation surface 3a which connects both ends of the heat dissipation surface 3e in a circumferential direction. The installation surface 3a is vertically provided with respect to the reference surface 2a and is formed to be a plane parallel to a straight line D connecting centers of the leads 6. On the installation surface 3a, the semiconductor laser element 5 is installed via the sub-mount 4.

The heat dissipation surface 3e is formed of a cylindrical surface having the same diameter as that of the outer circumferential surface 2e of the eyelet 2 and is disposed on the same plane as a part of the outer circumferential surface 2e. Thereby, the protrusion portion 3 is extended to a circumferential edge of the eyelet 2, so that it is possible to increase a volume and a surface area of the protrusion portion 3 and increase a bonding area between the protrusion portion 3 and the eyelet 2. Accordingly, heat dissipation capability of the protrusion portion 3 and heat conductivity between the protrusion portion 3 and the eyelet 2 become high, so that the heat dissipation characteristic of the semiconductor laser device 1 is improved.

At this time, the installation surface 3a is arranged so as to be deviated from a center of the eyelet 2 in top view and the protrusion portion 3 is installed over a region A1 and a region A2 that are obtained by division by the center line C that is parallel to the installation surface 3a The installation surface 3a and the leads 6 are disposed only in the region A1 and the heat dissipation surface 3e is disposed on circumferential edges of the region A1 and the region A2. Thereby, an exclusive possession area of the protrusion portion 3 on the reference surface 2a becomes 50% or more. Thus, it is possible to further increase the volume and the surface area of the protrusion portion 3 and further increase the bonding area between the protrusion portion 3 and the eyelet 2.

Furthermore, the output portion 5a of the semiconductor laser element 5 and the leads 6 are disposed on the straight line D in top view. A conventional semiconductor laser device generally has a lead and a semiconductor laser element, which are disposed on a center line of an eyelet in a columnar shape. Thus, it is possible to mount the semiconductor laser device 1 on a mounting substrate, which is the same as a conventional one, without changing a relative position of the output portion 5a.

In the semiconductor laser device 1 that has the configuration described above, electric power is supplied to the semiconductor laser element 5 via the leads 6, and laser light is output upward from the output portion 5a of the semiconductor laser element 5. Heat generated by the semiconductor laser element 5 is transmitted to the protrusion portion 3 via the sub-mount 4, and is then transmitted to the eyelet 2. Thereby, the heat is dissipated from the upper surface 3d, the installation surface 3a, and the heat dissipation surface 3e of the protrusion portion 3, and dissipated from the outer circumferential surface 2e, the reference surface 2a, and the bottom surface 2g of the eyelet 2.

At this time, since the volume and the surface area of the protrusion portion 3 are large, high heat dissipation capability of the protrusion portion 3 is able to be achieved. Moreover, since the bonding area between the protrusion portion 3 and the eyelet 2 is large, it is possible to increase the heat conductivity between the protrusion portion 3 and the eyelet 2. Accordingly, the heat dissipation characteristic of the semiconductor laser device 1 is able to be improved.

According to the present embodiment, the protrusion portion 3 that protrudes upward from the reference surface 2a of the eyelet 2 (base) has the installation surface 3a of the semiconductor laser element 5, and the heat dissipation surface 3e which is formed by the side surface disposed on the same plane as the part of the outer circumferential surface 2e of the eyelet 2. Thus, the heat transmitted from the semiconductor laser element 5 to the protrusion portion 3 via the sub-mount 4 is dissipated from the eyelet 2 and dissipated from the heat dissipation surface 3e. Moreover, since the volume and the surface area of the protrusion portion 3 are able to be increased, the high heat dissipation capability of the protrusion portion 3 is able to be achieved. Additionally, since the bonding area between the protrusion portion 3 and the eyelet 2 is able to be increased, it is possible to increase a heat dissipation amount from the eyelet 2. Accordingly, it is possible to suppress a temperature rise of the semiconductor laser element 5 by improving the heat dissipation characteristic of the semiconductor laser device 1 with the simple configuration.

Moreover, since the semiconductor laser device 1 is formed of the capless package type in which the upper side of the semiconductor laser element 5 is open, the heat is prevented from being accumulated in an inside of a cap, so that the heat dissipation characteristic of the semiconductor laser device 1 is able to be further improved. Note that, since the semiconductor laser element 5 has high reliability, even when hermetic sealing with the cap is not performed, a large obstacle for the semiconductor laser device 1 is not caused.

Furthermore, since the eyelet 2 is formed into the columnar shape and the heat dissipation surface 3e is formed of the cylindrical surface, it is possible to easily achieve the semiconductor laser device 1 in which the heat dissipation surface 3e is disposed on the same plane as the outer circumferential surface 2e.

Moreover, since the exclusive possession area of the protrusion portion 3 on the reference 2a is 50% or more, it is possible to further increase the volume and the surface area of the protrusion portion 3 and further increase the bonding area between the protrusion portion 3 and the eyelet 2. Accordingly, the heat dissipation characteristic of the semiconductor laser device 1 is able to be further improved.

Furthermore, the eyelet 2 is formed to be substantially line symmetric with the center line C that is parallel to the installation surface 3a in top view. The protrusion portion 3 is provided over the region A1 (first region) and the region A2 (second region) that are obtained by division by the center line C. The installation surface 3a and the leads 6 are disposed only in the region A1 and the heat dissipation surface 3e is disposed on the circumferential edge of the region A2. Thereby, it is possible to further increase the volume and the surface area of the protrusion portion 3 and further increase the bonding area between the protrusion portion 3 and the eyelet 2. Accordingly, the heat dissipation characteristic of the semiconductor laser device 1 is able to be further improved.

A plurality of notches 2c and the notch 2d are provided on the outer circumferential surface 2e of the eyelet 2, and upper sides of the notches 2c and the notch 2d are covered by the protrusion portion 3. Thereby, the semiconductor laser device 1 is able to be easily positioned for mounting at a desired position. Moreover, it is possible to increase a surface area of the eyelet 2, and since the protrusion portion 3 protrudes outwardly from upper edges of the notches 2c and the notch 2d, it is possible to increase the volume of the protrusion portion 3. Accordingly, the heat dissipation characteristic of the semiconductor laser device 1 is able to be further improved.

Moreover, since materials of the eyelet 2 and the protrusion portion 3 are formed of copper-based metal whose heat conductivity is high, the heat dissipation characteristic of the semiconductor laser device 1 is able to be further improved.

Since the sub-mount 4 is formed of a material of AlN or SiC, the heat dissipation characteristic of the semiconductor laser device 1 is able to be further improved.

Second Embodiment

Figure 7:
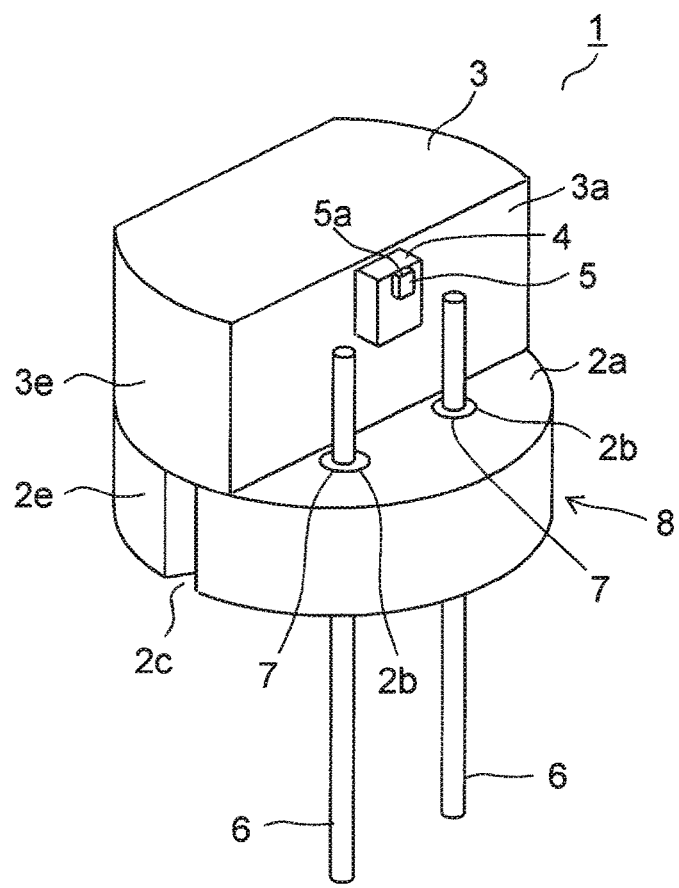
FIG. 7 is a perspective view of a semiconductor laser device of a second embodiment of the invention as seen from a front side.
Figure 8:
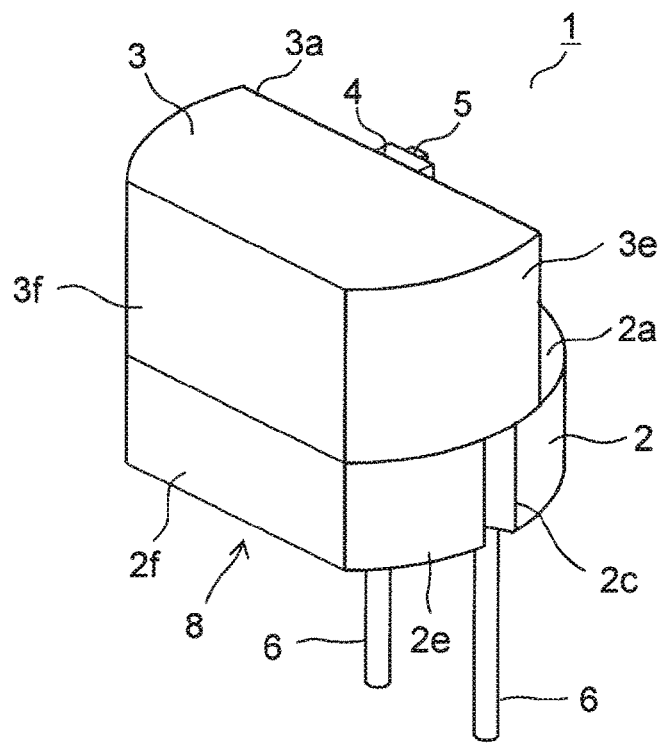
FIG. 8 is a perspective view of the semiconductor laser device of the second embodiment of the invention as seen from a rear side.

Next, FIGS. 7 and 8 are perspective views of a semiconductor laser device 1 of a second embodiment as seen from a front side and a rear side, respectively. The present embodiment is different from the first embodiment illustrated in FIGS. 1 to 6 described above in shapes of the eyelet 2 and the protrusion portion 3, and is similar to the first embodiment in the other parts.

The eyelet 2 includes the outer circumferential surface 2e formed of the cylindrical surface and an outer circumferential surface 2f that is formed of a plane. The protrusion portion 3 includes the heat dissipation surface 3e formed of the side surface of the cylindrical surface and a heat dissipation surface 3f that is formed of a side surface of a plane parallel to the installation surface 3a. The heat dissipation surface 3e of the protrusion portion 3 is disposed on the same plane as the part of the outer circumferential surface 2e of the eyelet 2. The heat dissipation surface 3f of the protrusion portion 3 is disposed on the same plane as the outer circumferential surface 2f of the eyelet 2.

Thereby, at the time of mounting the semiconductor laser device 1, the outer circumferential surface 2f and the heat dissipation surface 3f of the plane are used as contact surfaces for positioning, and it is possible to arrange the output portion 5a at a predetermined position with high accuracy.

In a case where a heat sink that is connected to the metal stem 8 is provided, the heat sink is able to be easily arranged on the outer circumferential surface 2f and the heat dissipation surface 3f of the plane in a contact manner. At this time, since a distance between the installation surface 3a and the heat dissipation surface 3f is able to be formed short, the heat conductivity between the heat sink and the semiconductor laser element 5 is able to be increased.

According to the present embodiment, it is possible to obtain an effect similar to that of the first embodiment. Moreover, since the outer circumferential surface 2f of the eyelet 2 and the heat dissipation surface 3f are formed of the plane parallel to the installation surface 3a, the semiconductor laser device 1 is able to be easily positioned at a predetermined position for mounting. Furthermore, in a case where a heat sink is separately provided, the heat sink is able to be easily connected to the metal stem 8.

Third Embodiment

Figure 9:
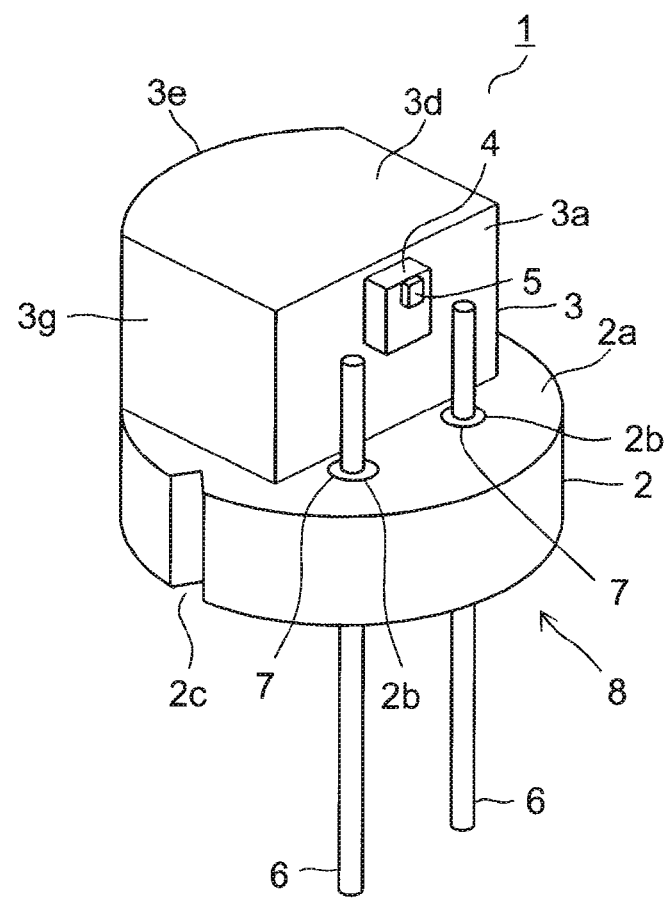
FIG. 9 is a perspective view of a semiconductor laser device of a third embodiment of the invention as seen from a front side.

Next, FIG. 9 is a perspective view of a semiconductor laser device 1 of a third embodiment as seen from a front side. The present embodiment is different from the first embodiment illustrated in FIGS. 1 to 6 described above in a shape of the protrusion portion 3 and is similar to the first embodiment in the other parts.

Heat dissipation surfaces 3g by which both side ends of the installation surface 3a of the plane are connected to both side ends of the heat dissipation surface 3e of the cylindrical surface are provided on side surfaces of the protrusion portion 3. The heat dissipation surface 3e of the protrusion portion 3 is disposed on the same plane as a part of the outer circumferential surface 2e of the eyelet 2. Since the heat dissipation surfaces 3g are arranged so as to be apart from the outer circumferential surface 2e formed of the cylindrical surface of the eyelet 2, the volume of the protrusion portion 3 is reduced as compared to that of the first embodiment, but the heat transmitted from the semiconductor laser element 5 is dissipated.

According to the present embodiment, it is possible to obtain an effect similar to that of the first embodiment.

In the first to third embodiments, a planar shape of the eyelet 2 is formed into a circular shape or a partially circular shape, but may be formed into another shape such as a polygonal shape (a rectangular shape, a hexagonal shape, or the like) or an elliptical shape.

Industrial Applicability

An aspect of the invention is able to be used for a semiconductor laser device having a metal stem.

REFERENCE SIGNS LIST 1 semiconductor laser device
2 eyelet (base)
2a reference surface
2b through hole
2c, 2d notch
2e, 2f outer circumferential surface
3 protrusion portion
3a installation surface
3e, 3f, 3g heat dissipation surface
4 sub-mount
5 semiconductor laser element
5a output portion
6 lead
7 insulator
8 metal stem
A1, A2 region
C center line
D straight line

The invention claimed is:

1. A semiconductor laser device comprising: a semiconductor laser element that outputs light from an output portion; and a metal stem that holds the semiconductor laser element, wherein the metal stem includes: a base that has a reference surface on an upper surface and a plurality of notches on an outer circumferential surface of the base; and a protrusion portion that is bonded to, and protrudes upward from, the reference surface, the protrusion portion has an installation surface on which the semiconductor laser element is installed and a side surface which is disposed on an identical plane with a part of the outer circumferential surface, and upper sides of the notches are covered by the protrusion portion.

2. The semiconductor laser device according to claim 1, wherein an upper side of the semiconductor laser element is open.

3. The semiconductor laser device according to claim 1, wherein the base is formed into a columnar shape.

4. The semiconductor laser device according to claim 1, wherein a part of the side surface of the protrusion portion and the part of the outer circumferential surface of the base are formed of a plane parallel to the installation surface.

5. The semiconductor laser device according to claim 1, wherein an exclusive possession area of the protrusion portion on the reference surface is 50% or more.

6. The semiconductor laser device according to claim 1, wherein the metal stem includes a pair of leads that is connected to the semiconductor laser element by penetrating the base, the base is formed to be substantially line symmetric with a center line that is parallel to the installation surface in top view, the protrusion portion is installed over a first region and a second region that are obtained by division by the center line, the installation surface and the leads are disposed only in the first region, and the side surface of the protrusion portion is disposed on a circumferential edge of the second region.

7. The semiconductor laser device according to claim 6, wherein centers of the leads and the output portion are disposed on a straight line in top view.

8. The semiconductor laser device according to claim 1, wherein materials of the base and the protrusion portion are formed of copper-based metal.

9. The semiconductor laser device according to claim 1, wherein the semiconductor laser element is disposed on the installation surface via a sub-mount, and the sub-mount is formed of a material of AlN or SiC.

10. The semiconductor laser device according to claim 1, wherein the semiconductor laser element includes a GaAs-based substrate and outputs red light.

11. The semiconductor laser device according to claim 1, wherein the semiconductor laser element includes a GaN-based substrate and outputs green light.

* * * * *